United States Patent
Dong et al.

(10) Patent No.: US 7,916,533 B2
(45) Date of Patent: Mar. 29, 2011

(54) FORECASTING PROGRAM DISTURB IN MEMORY BY DETECTING NATURAL THRESHOLD VOLTAGE DISTRIBUTION

(75) Inventors: Yingda Dong, San Jose, CA (US); Cynthia Hsu, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 171 days.

(21) Appl. No.: 12/490,557

(22) Filed: Jun. 24, 2009

(65) Prior Publication Data
US 2010/0329002 A1 Dec. 30, 2010

(51) Int. Cl.
G11C 11/34 (2006.01)
G11C 16/04 (2006.01)

(52) U.S. Cl. ............................... 365/185.02; 365/185.24
(58) Field of Classification Search ............ 365/185.02, 365/185.17, 185.19, 185.24
See application file for complete search history.

(56) References Cited

U.S. PATENT DOCUMENTS

| 5,859,795 | A | 1/1999 | Rolandi |
| 6,456,528 | B1 | 9/2002 | Chen |
| 6,560,152 | B1 | 5/2003 | Cernea |
| 6,634,004 | B1 | 10/2003 | Yamada |
| 6,717,847 | B2 | 4/2004 | Chen |
| 6,801,454 | B2 | 10/2004 | Wang |
| 7,170,788 | B1 * | 1/2007 | Wan et al. ................. 365/185.18 |
| 7,177,199 | B2 | 2/2007 | Chen |
| 7,180,775 | B2 | 2/2007 | Meir |
| 7,193,901 | B2 | 3/2007 | Ruby |
| 7,366,022 | B2 | 4/2008 | Li |
| 7,447,086 | B2 | 11/2008 | Wan et al. |
| 7,468,911 | B2 * | 12/2008 | Lutze et al. ............... 365/185.17 |
| 2005/0083735 | A1 | 4/2005 | Chen et al. |
| 2007/0242524 | A1 * | 10/2007 | Hemink .................. 365/185.28 |
| 2008/0175064 | A1 | 7/2008 | Wang |
| 2008/0198651 | A1 | 8/2008 | Kim |
| 2008/0198665 | A1 | 8/2008 | Mokhlesi |
| 2008/0279008 | A1 | 11/2008 | Dong et al. |
| 2009/0067120 | A1 | 3/2009 | Roohparvar |
| 2009/0129146 | A1 | 5/2009 | Sarin et al. |
| 2009/0141557 | A1 | 6/2009 | Fujiu |

FOREIGN PATENT DOCUMENTS

| EP | 1964127 | 9/2008 |
| WO | 2007078793 A1 | 7/2007 |

OTHER PUBLICATIONS

International Search Report and the Written Opinion dated Oct. 4, 2010, International Appln. No. PCT/US2010/037842 filed Jun. 8, 2010.

* cited by examiner

Primary Examiner — Anh Phung
(74) Attorney, Agent, or Firm — Vierra Magen Marcus & DeNiro LLP

(57) ABSTRACT

Program disturb is reduced in a non-volatile storage system during a programming operation by determining a susceptibility of a set of storage elements to program disturb and taking a corresponding precautionary measure, if needed, to reduce the likelihood of program disturb occurring. During programming of a lower page of data, a natural threshold voltage distribution of the set of storage elements is determined by tracking storage elements which are programmed to a particular state, and determining how many program pulses are need for a number N1 and a number N2>N1 of the storage elements to reach the particular state. Temperature and word line position can also be used to determine the susceptibility to program disturb. A precautionary measure can involve using a higher pass voltage, or abandoning programming of an upper page of data or an entire block. In some cases, programming continues with no precautionary measure.

20 Claims, 14 Drawing Sheets

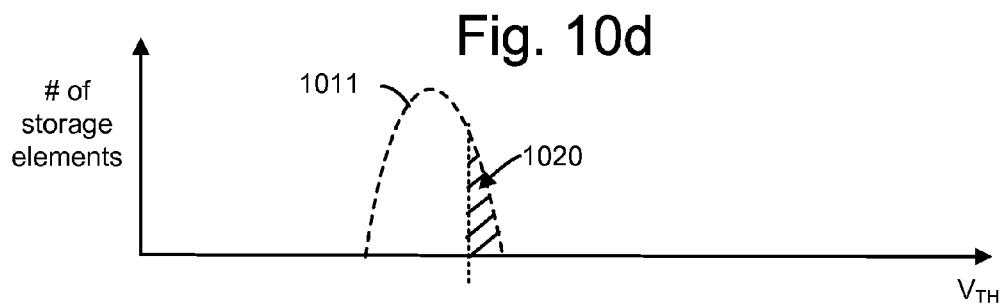
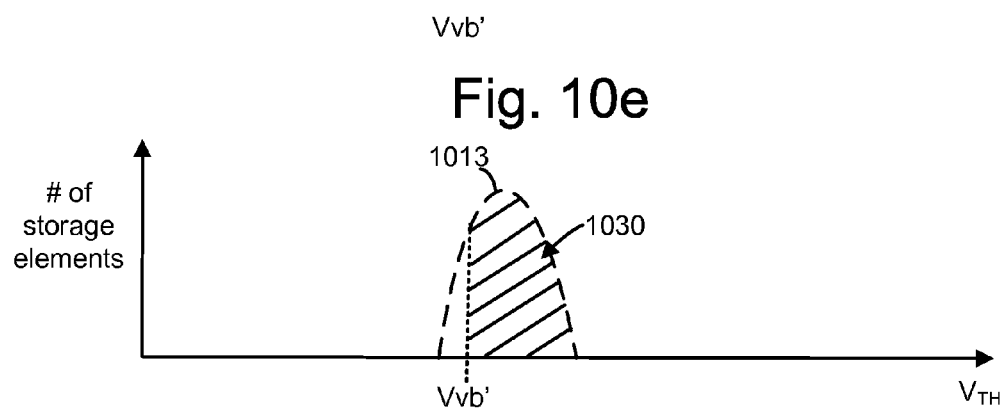
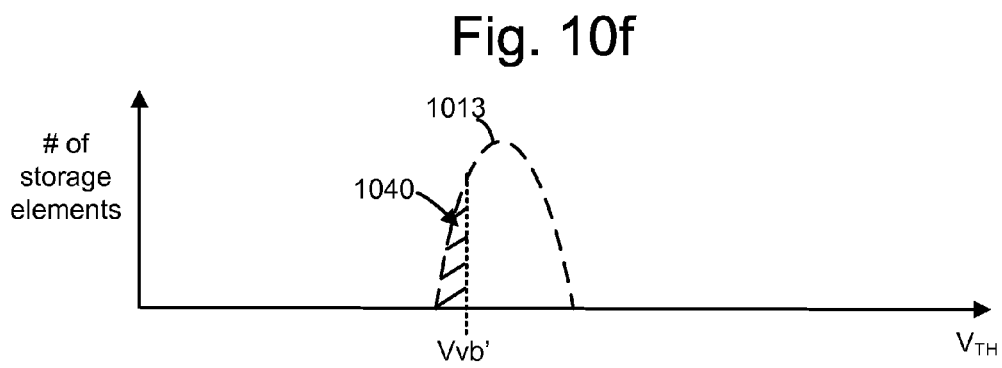

FORECASTING PROGRAM DISTURB IN MEMORY BY DETECTING NATURAL THRESHOLD VOLTAGE DISTRIBUTION

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. $V_{PGM}$ can be applied to the control gates of flash memory elements. In the periods between the programming pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

However, one issue which continues to be problematic is program disturb. Program disturb can occur at inhibited, unselected NAND strings during programming of other, selected NAND strings. Program disturb occurs when the threshold voltage of an unselected non-volatile storage element is shifted due to programming of other non-volatile storage elements. Program disturb can occur on previously programmed storage elements as well as erased storage elements that have not yet been programmed.

BRIEF DESCRIPTION OF THE DRAWINGS

FIGS. 10d-f depict distributions from FIG. 10a in further detail.

DETAILED DESCRIPTION

A method and non-volatile storage system are provided in which a susceptibility to program disturb is detected and a corresponding precautionary measure is taken.

Figure 1A:
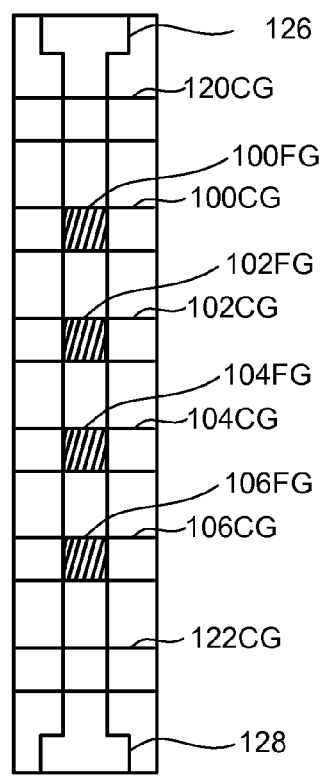
FIG. 1a is a top view of a NAND string.
Figure 1B:
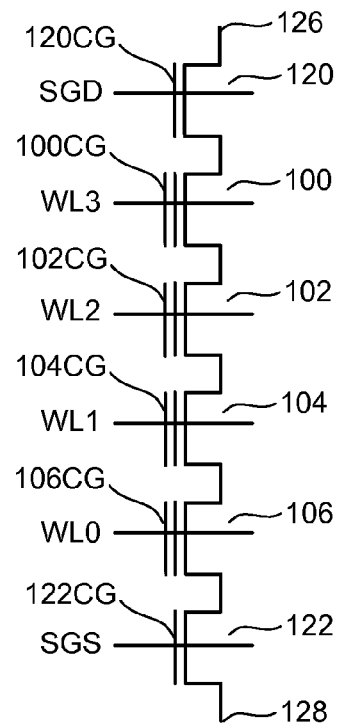
FIG. 1b is an equivalent circuit diagram of the NAND string.

One example of a memory system suitable for implementing the present invention uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
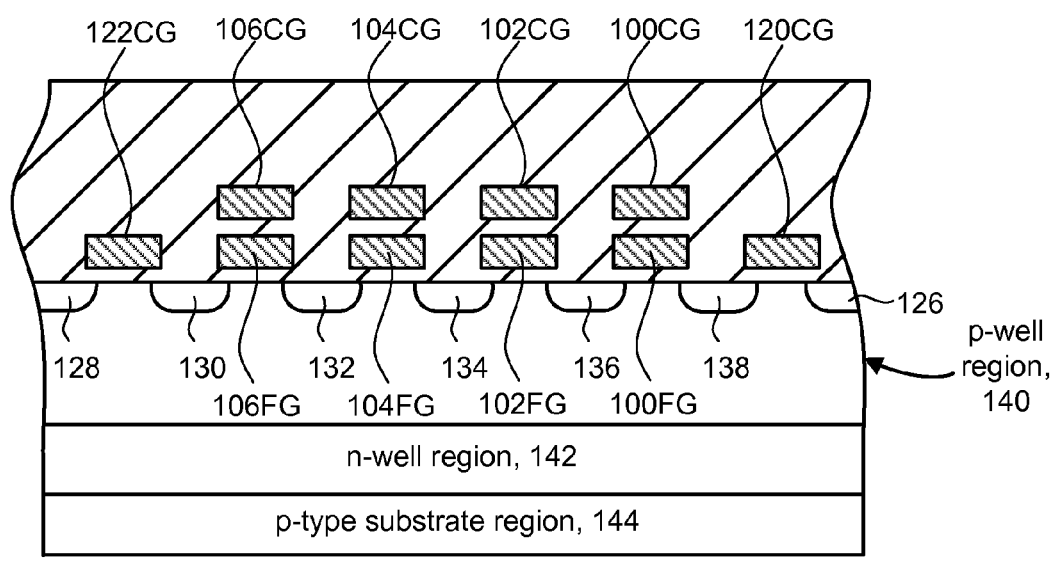
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a, 1b and 2 show four memory cells in the NAND string, a NAND string used with the technology described herein can have fewer than four memory cells or more than four memory cells. For example, some NAND strings will include 8, 16, 32 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
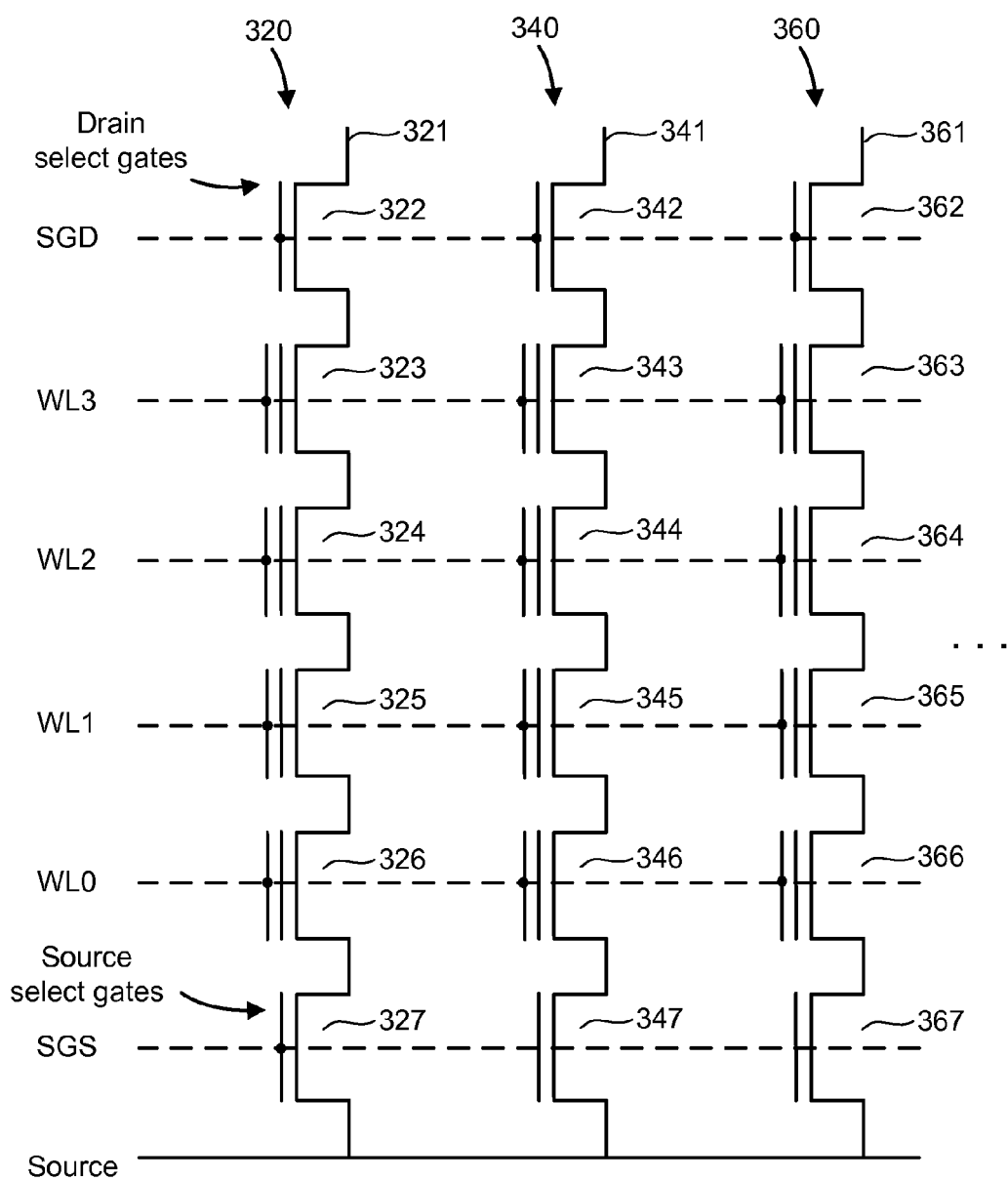
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the $V_{TH}$ of a charge storage element due to capacitive coupling with other neighboring storage elements that are programmed later, can also contribute to program disturb.

Figure 4:
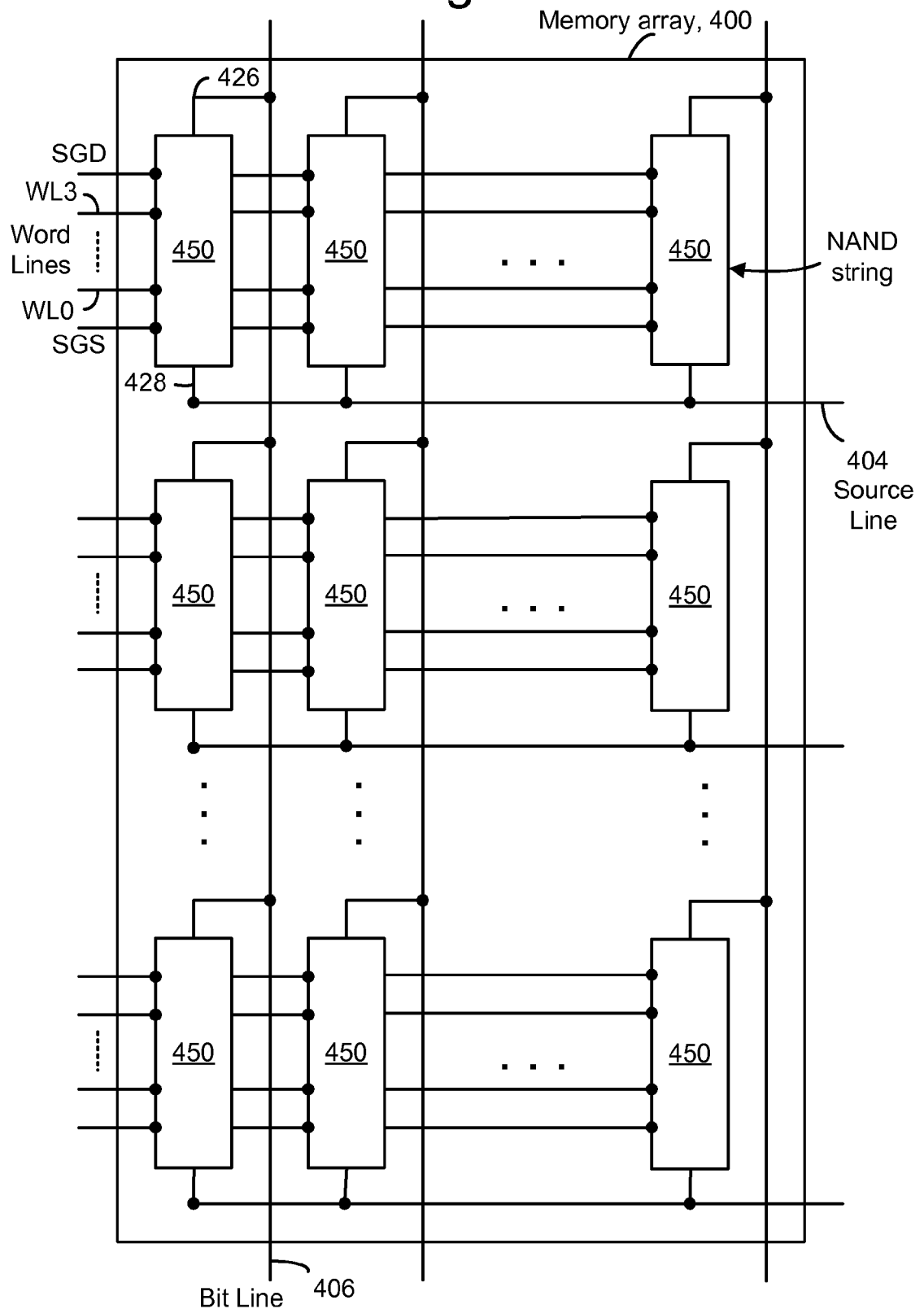
FIG. 4 is a block diagram of an array of NAND flash storage elements.

FIG. 4 illustrates an example of an array 400 of NAND storage elements, such as those shown in FIGS. 1a and 1b. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 5:
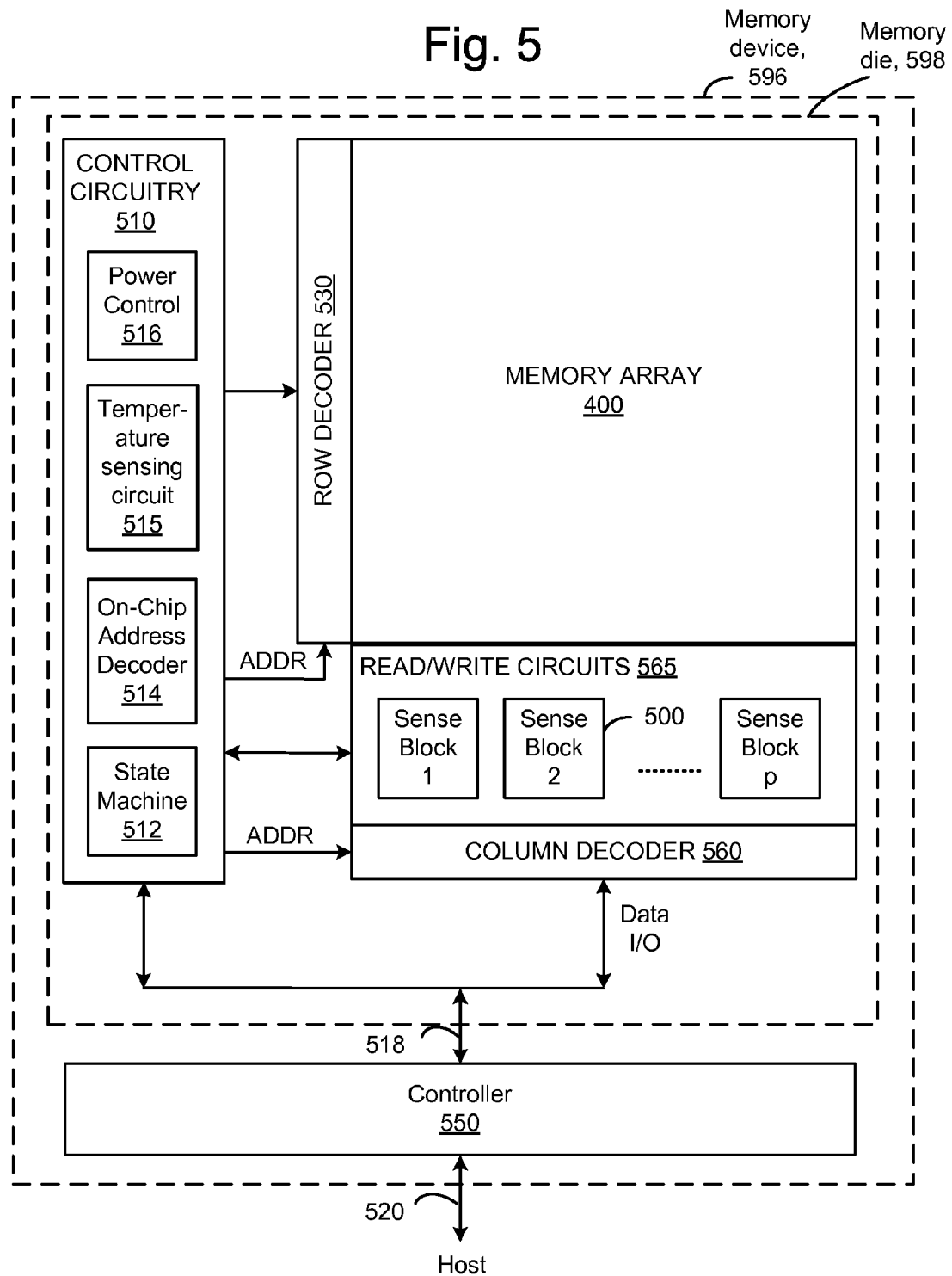
FIG. 5 is a block diagram of a non-volatile memory system using single row/column decoders and read/write circuits.

FIG. 5 is a block diagram of a non-volatile memory system using single row/column decoders and read/write circuits. The diagram illustrates a memory device 596 having read/write circuits for reading and programming a page of storage elements in parallel, according to one embodiment of the present technology. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, a temperature sensing circuit 515 and a power control module 516. The state machine 512 provides chip-level control of memory operations. The on-chip address decoder 514 provides an address interface between that used by the host or a memory controller to the hardware address used by the decoders 530 and 560. The temperature sensing circuit 515 can be used for providing a temperature based signal or data for use in a programming operation, as discussed further below. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, temperature sensing circuit 515, power control 516, sense blocks 500, read/write circuits 565, controller 550, etc.

Regarding the temperature sensing circuit 515, in present non-volatile storage devices, such as NAND flash memory devices, temperature variations present various issues in reading and writing data. A memory device is subject to varying temperatures based on the environment in which it is located. For example, some current memory devices are rated for use between −30° C. and +85° C. Devices in industrial, military and even consumer applications may experience significant temperature variations.

Various techniques are known for providing temperature-compensated signals. One or more of these techniques can be used to provide a temperature-dependency for $V_{OPTIMAL}$. Most of these techniques do not rely on obtaining an actual temperature measurement, although this approach is also possible. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. U.S. Pat. No. 6,560,152, titled "Non-Volatile Memory With Temperature-Compensated Data Read", incorporated herein by reference, uses a bias generator circuit which biases a voltage which is applied to a source or drain of a data storage element. Any of these techniques, as well as any other known techniques, can be used by the temperature sensing circuit 515.

In another embodiment, a non-volatile memory system uses dual row/column decoders and read/write circuits. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

Figure 6:
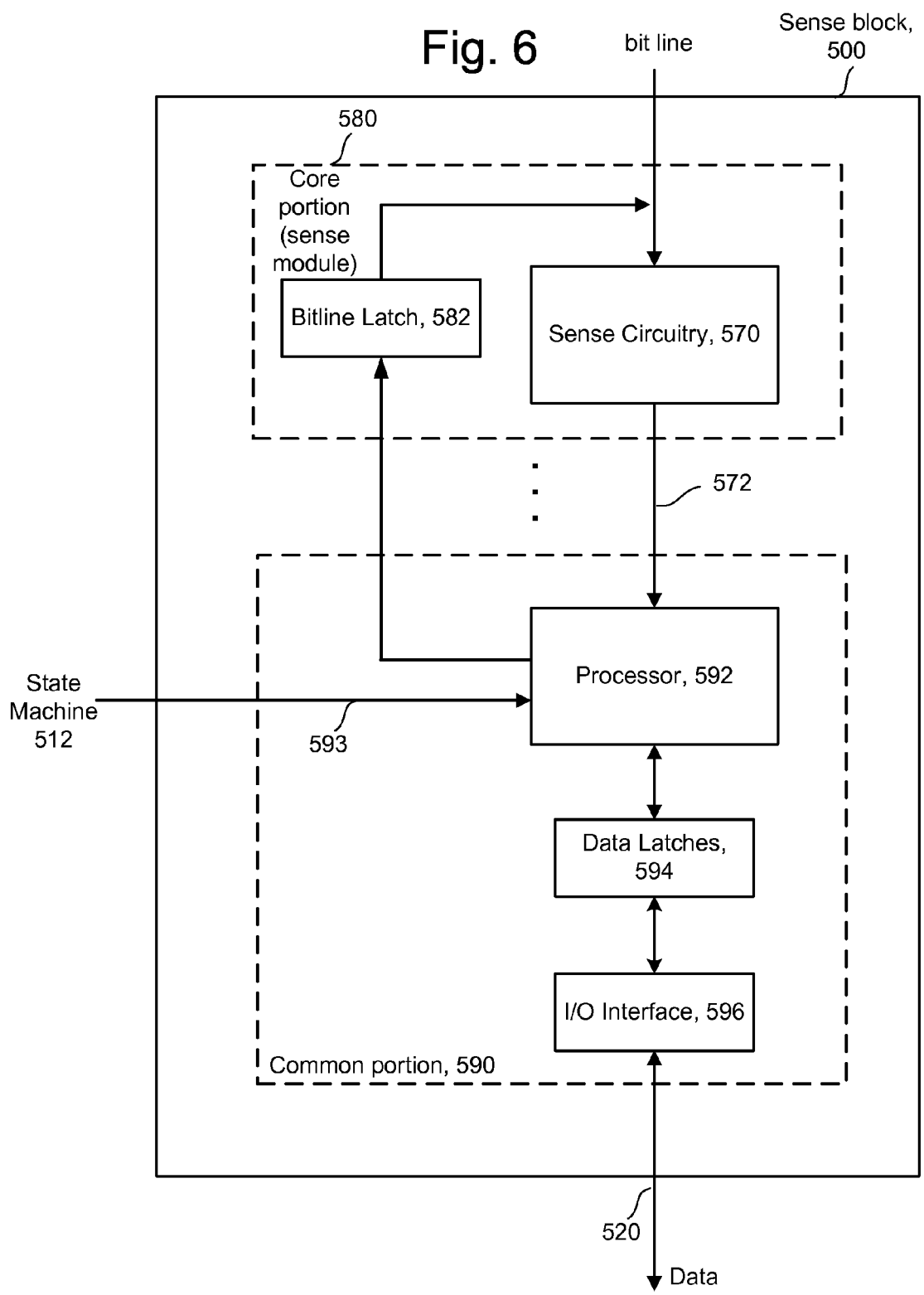
FIG. 6 is a block diagram depicting one embodiment of a sense block.

FIG. 6 is a block diagram depicting one embodiment of a sense block. An individual sense block 500 is partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 512 that controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594 from the data bus 520. The program operation, under the control of the state machine, comprises a series of programming voltage pulses applied to the control gates of the addressed storage elements. Each programming pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if programming pulses appear on its control gate. In other embodiments the processor initially loads the bit line latch 582 and the sense circuitry sets it to an inhibit value during the verify process.

Data latch stack 594 contains a stack of data latches corresponding to the sense module. In one embodiment, there are three data latches per sense module 580. In some implementations (but not required), the data latches are implemented as a shift register so that the parallel data stored therein is converted to serial data for data bus 520, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7:
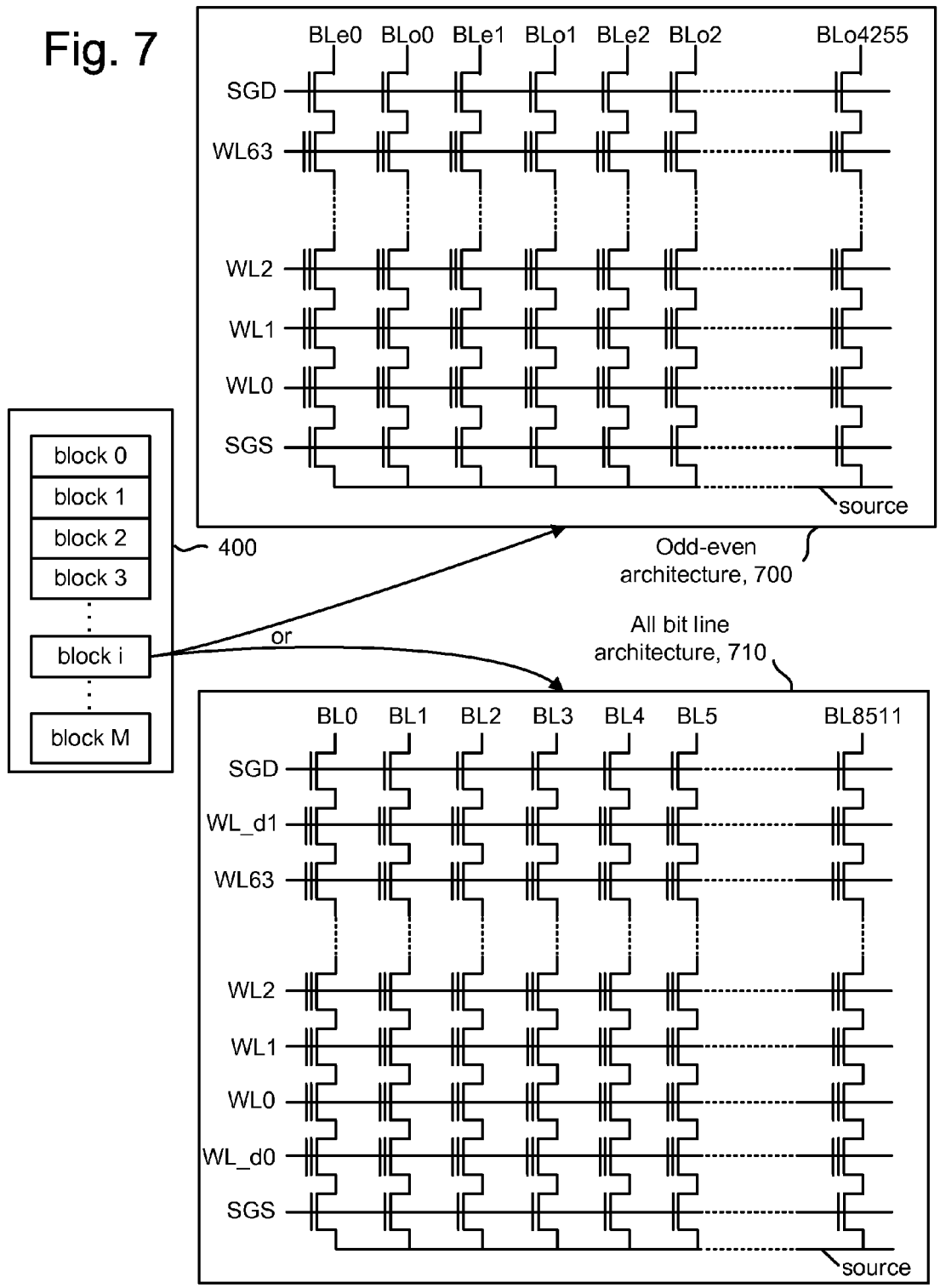
FIG. 7 illustrates an example of an organization of a memory array into blocks for an all bit line memory architecture or for an odd-even memory architecture.

FIG. 7 illustrates an example of an organization of a memory array into blocks for an all bit line memory architecture or for an odd-even memory architecture. Exemplary structures of memory array 400 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, ... BL8511. In one embodiment referred to as an all bit line (ABL) architecture (architecture 710), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 700), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns, and sixty-four storage elements are shown connected in series in a column to form a NAND string.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

Figure 8:
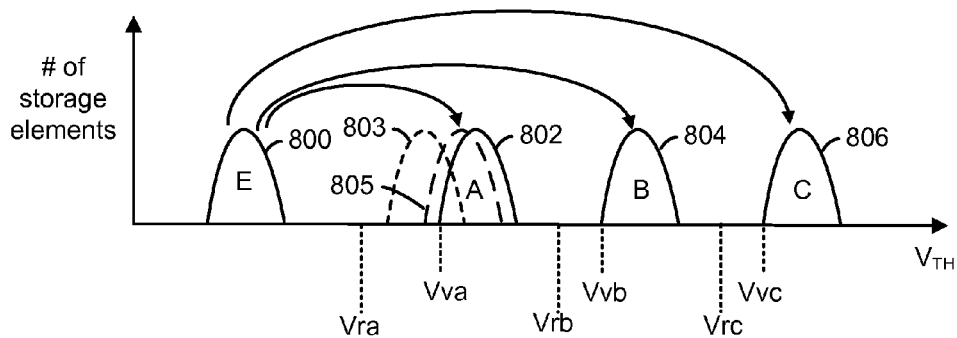
FIG. 8 depicts an example set of threshold voltage distributions and one-pass programming.

FIG. 8 depicts an example set of threshold voltage distributions and one-pass programming. Example threshold voltage distributions for the storage element array are provided for a case where each storage element stores two bits of data. A first threshold voltage distribution 800 is provided for erased (E state) storage elements. Three threshold voltage distributions 802, 804 and 806 represent programmed states A, B and C, respectively. In one embodiment, the threshold voltages in the E distribution are negative and the threshold voltages in the A, B and C distributions are positive. Distribution 803 and 805 represent transient distributions which the A-state storage elements (the storage elements which are intended to be programmed to a target state which is the A-state), respectively, undergo before reaching the final distribution 802. For instance, the distribution 803 indicates that a certain number N1 or portion of A-state storage element have reached the A state.

Similarly, the distribution 805 indicates that a number N2>N1 or portion of A-state storage elements have reached the A state.

The distributions 803 and 805 can be used to determine a natural threshold voltage distribution of a set of storage elements. A relatively small natural threshold voltage distribution indicates that the storage elements have relatively similar programming speeds, while a relatively large natural threshold voltage distribution indicates that the storage elements have a relatively wider range of programming speeds. In one approach, we determine a number of program pulses PPN1 which result in N1 of the A-state storage elements reaching state A, and a number of program pulses PPN2>PPN1 which result in N2>N1 of the A-state storage elements reaching state A. In another possible approach, we determine a number of program pulses PPN2>PPN1 which result in N1 (or some other number) or fewer of the A-state storage elements not yet reaching state A. PPN2−PPN1 represents a natural threshold voltage distribution of the set of storage elements. In one approach, storage elements which are programmed to the lowest programmed state (e.g., the A state in this example) can be tracked to determine natural threshold voltage distribution.

Generally, data is encoded into $2^N$ data states using two or more bits per storage element (e.g., four or more states), and encoding schemes are used in which an approximately equal number of storage elements are programmed into each state. For example, with four states: E, A, B and C, about one fourth of the storage elements on a selected word line will be programmed to the E state, another one fourth of the storage elements will be programmed to the A state, another one fourth of the storage elements will be programmed to the B state, and another one fourth of the storage elements will be programmed to the C state. Thus, different subsets of storage elements are programmed to different states, one subset per state.

A particular state, e.g., one of the available four or more states, can be selected as a tracked state. The tracking determines when a portion of the storage elements which are intended to be programmed to the particular state are verified to reach the particular data state. For example, assume state A is the tracked state, and 1024 storage elements on a word line are being programmed, with 256 to remain in the E state, 256 to be programmed to the A state, 256 to be programmed to the B state, and 256 to be programmed to the C state.

In one possible approach, N1 is set to a relatively small number such as 5% of the A-state storage elements, e.g., 5% of 256=13 storage elements, and N2 is set to a relatively high number such as 95% of the A-state storage elements, e.g., 95% of 256=243 storage elements. This avoids erratic results which might be obtained by tracking only the first and last A-state storage elements to reach the A-state, for instance. Moreover, note that it is easier to have a checkpoint which is based on a verify level which is already used for a state instead of adding extra checkpoints and verify levels. However, it is possible to use a checkpoint which does not correspond to a data state. Moreover, the technology can apply generally to two, three or more bits per cell devices.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present technology can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

Figure 13:
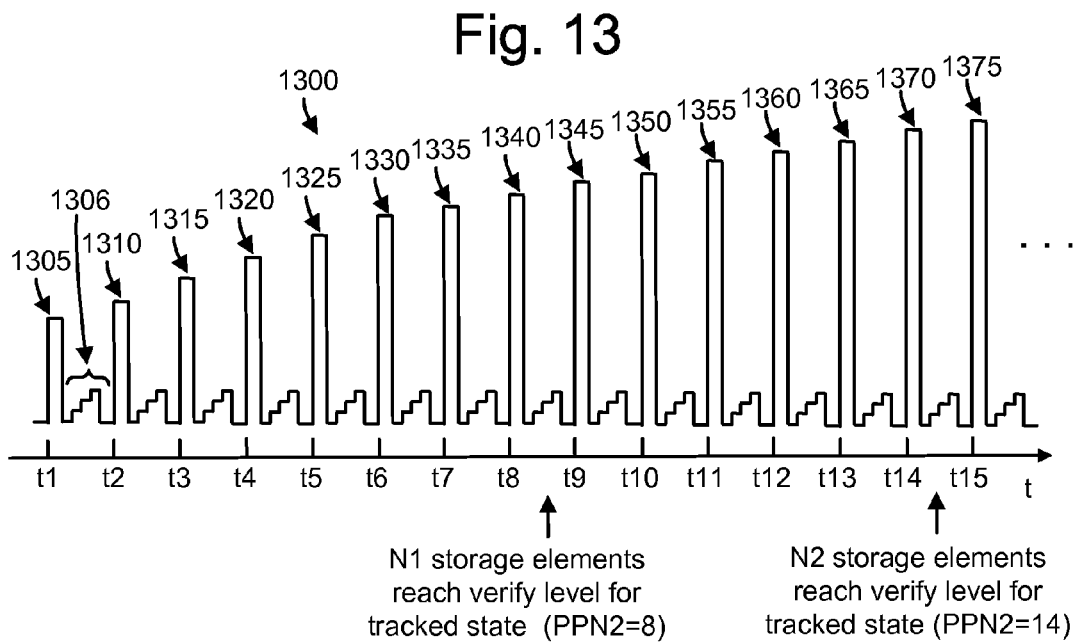
FIG. 13 depicts programming pulses in a programming operation.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 13 is used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 9:
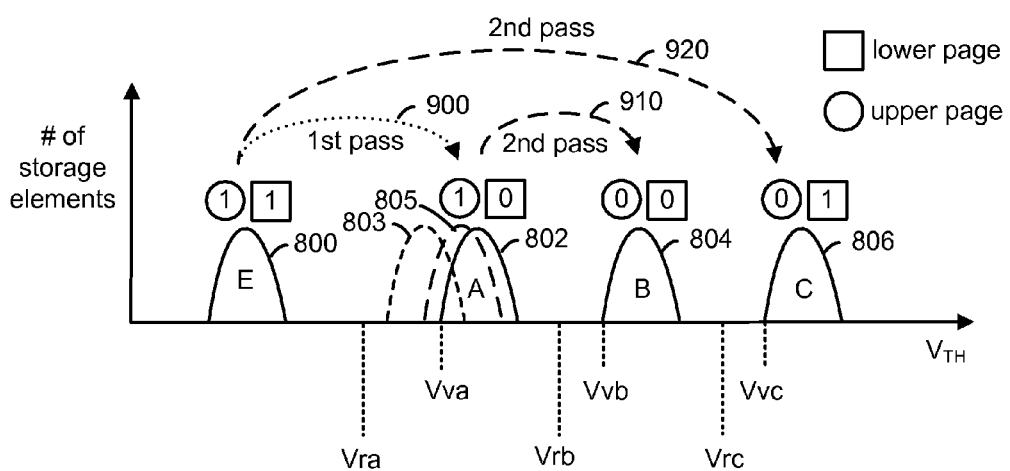
FIG. 9 depicts an example set of threshold voltage distributions and two-pass programming.

FIG. 9 illustrates an example of a two-pass technique of programming a multi-state storage element that stores data for two different pages: a lower page and an upper page. Four states are depicted by repeating the threshold voltage distributions 800, 802, 804 and 806 from FIG. 8. These states, and the bits they represent, are: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 900. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 920. If the storage element had been programmed into state A as a result of the first programming pass, then the storage element is further programmed in the second pass so that the threshold voltage is increased to be within state B, as depicted by arrow 910. The result of the second pass is to program the storage element into the state designated to store a logic "0" for the upper page without changing the data for the lower page. In both FIG. 8 and FIG. 9, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

If the A-state is tracked to determine a natural threshold voltage distribution, as discussed, the distribution 803 may represent when N1 A-state storage elements have reached the A state, and the distribution 805 may represent when N2 A-state storage elements have reached the A state or, alternatively, when N1 (or some other number) or fewer A-state storage elements have not yet reached the A state.

Figure 10A:
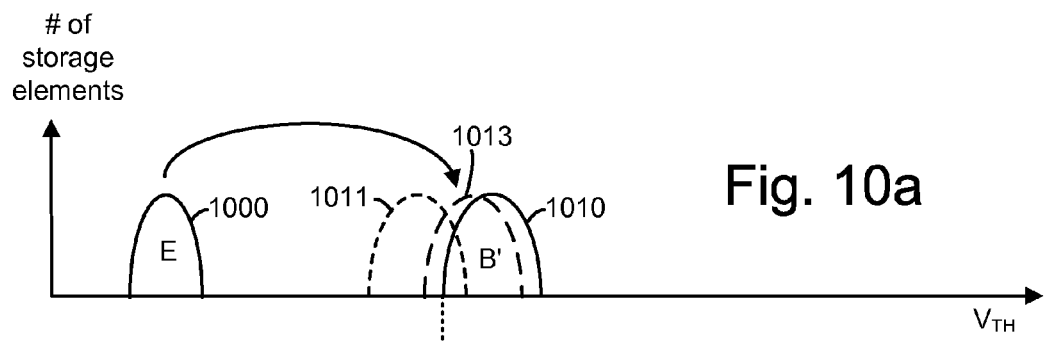
FIGS. 10a-c show various threshold voltage distributions and describe a process for programming non-volatile memory.
Figure 10B:
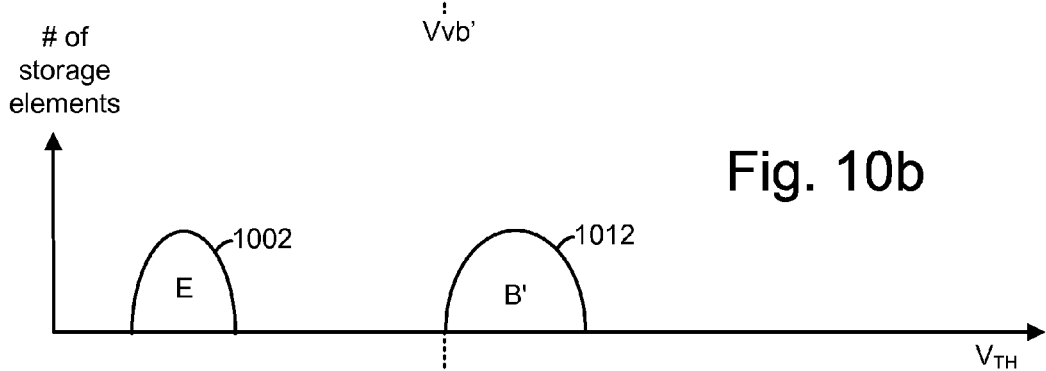
Figure 10C:
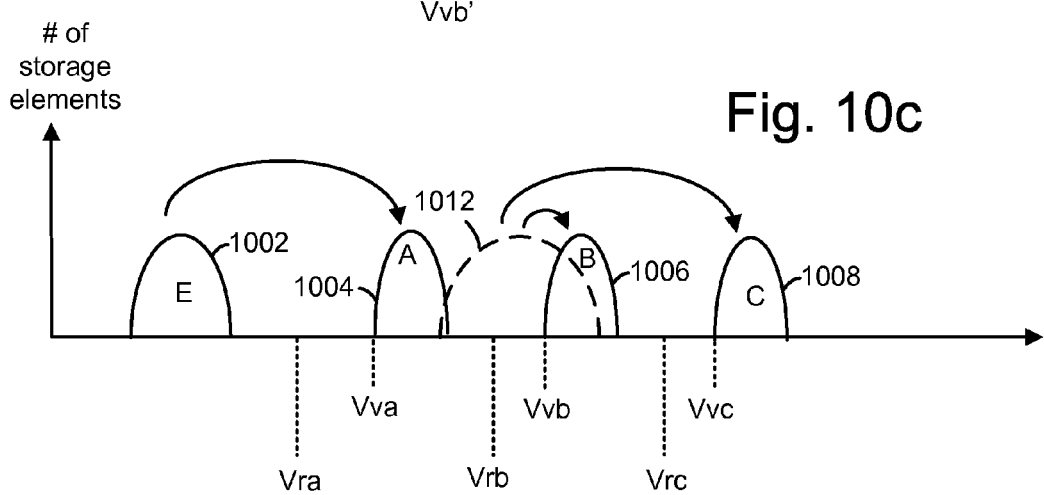

FIGS. 10a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E (distribution 1000). If the data is to be programmed to 0, then the threshold of voltage of the storage element is raised such that the storage element is programmed to state B' (distribution 1010). FIG. 10a therefore shows the programming of storage elements from state E to state B'. State B' is an interim state B; therefore, the verify point is depicted as Vvb', which is lower than Vvb. Typically, about half of the storage elements on the word line will remain in state E and half will be programmed to state B'

If the B'-state is tracked to determine a natural threshold voltage distribution, as discussed, the distribution 1011 may represent when N1 B'-state storage elements (storing lower page bit 0) have reached the B' state. The N1 B'-state storage elements which have reached the B' state are represented by area 1020 of the distribution 1011 (FIG. 10d). The distribution 1013 may represent when N2 B'-state storage elements have reached the B' state. The N2 B'-state storage elements which have reached the B' state are represented by area 1030 of the distribution 1013 (FIG. 10e). Alternatively, N1 or some other number of B'-state storage elements which have not yet reached the B' state are represented by area 1040 of the distribution 1013 (FIG. 10f). The B'-state storage elements are intended to be programmed to the B' state in the first programming pass, and subsequently programmed to the B or C states in the second programming pass. The B' state is an example of an intermediate or interim state which does not represent a data state having at least one bit of data.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1012 of FIG. 10b. This apparent widening of the threshold voltage distribution will be remedied when programming the upper page. The E state may also be widened, to a lesser extent, as depicted by distribution 1002.

FIG. 10c depicts the process of programming the upper page. If the storage element is in erased state E and the upper page is to remain at 1, then the storage element will remain in state E (distribution 1002). If the storage element is in state E and its upper page data is to be programmed to 0, then the threshold voltage of the storage element will be raised so that the storage element is in state A (distribution 1004). If the storage element was in intermediate threshold voltage distribution 1012 and the upper page data is to remain at 1, then the storage element will be programmed to final state B (distribution 1006). If the storage element is in intermediate threshold voltage distribution 1012 and the upper page data is to become data 0, then the threshold voltage of the storage element will be raised so that the storage element is in state C (distribution 1008). Typically, about one fourth of the storage elements on the word line will be programmed from state B' to state B, and one fourth of the storage elements on the word line will be programmed from state B' to state C.

The process depicted by FIGS. 10a-c reduces the effect of floating gate to floating gate coupling because only the upper page programming of neighbor storage elements will have an effect on the apparent threshold voltage of a given storage element. An example of an alternate state coding is to move from distribution 1012 to state C when the upper page data is a 1, and to move to state B when the upper page data is a 0.

Although FIGS. 10a-c provide an example with respect to four data states and two pages of data, the concepts taught can be applied to other implementations with more or fewer than four states and more or less than two pages. For example, memory devices with eight or sixteen states per storage element are currently planned or in production.

Figure 11:
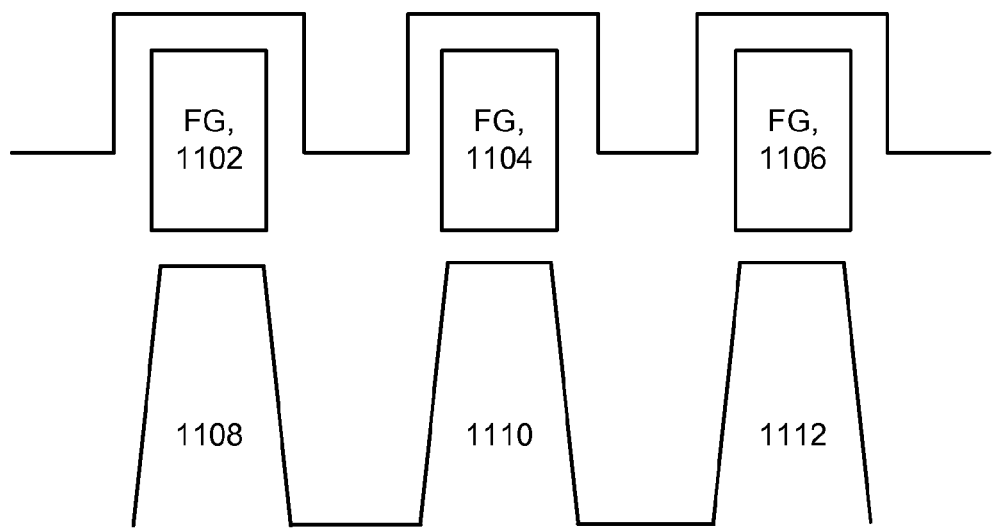
FIG. 11 is a cross section of NAND strings, and depicts channel boosting.

FIG. 11 is a cross section of NAND strings, and depicts channel boosting. The cross section depicts a control gate (CG) or selected word line 1100 which extends across multiple storage elements. Each storage element includes a floating gate (FG), e.g., FGs 1102, 1104 and 1106, which is over a respective channel area 1108, 1110, 1112 of the substrate, typically in a p-well. Each channel region is part of a NAND string which can be visualized as coming out of the page.

As mentioned above in connection with FIG. 3, storage elements which are in unselected NAND strings have their channels boosted during programming operations to inhibit programming and thereby avoid program disturb. Boosting is typically accomplished by applying a pass voltage, Vpass, to unselected word lines while a program voltage, Vpgm, is applied to a selected word line. A higher Vpass is correlated with a lower susceptibility to program disturb. However, Vpass cannot be too high or it may program the unselected NAND strings. Boosting inhibits programming of a floating gate by reducing the voltage across the floating gate.

Figure 12A:
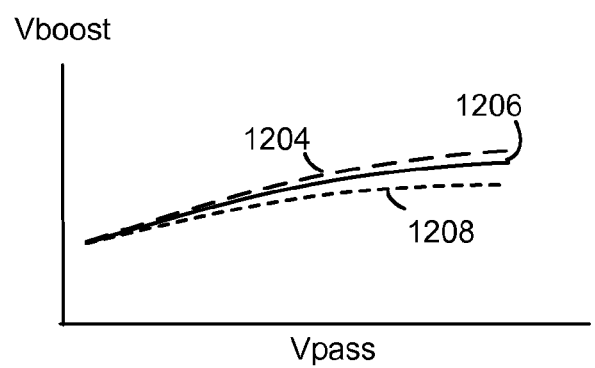
FIG. 12a depicts a channel boosting potential as a function of pass voltage and temperature.

FIG. 12a depicts a channel boosting potential as a function of pass voltage and temperature. The horizontal axis depicts a pass voltage (Vpass) applied to unselected word lines, and the vertical axis depicts a channel boosting potential (Vboost) of an inhibited/boosted channel. The channel boosting potential depends on the neighboring channels' potential as well as on Vpass. As mentioned, a higher Vpass generally correlates with a higher Vboost. Boosting also has a strong temperature dependence. At high temperatures, boosting is more difficult, and the channel potential saturates at a lower level due to a high reverse bias leakage current in the channel. At low temperatures, the reverse bias leakage current is much lower, so the situation is improved and a higher Vboost can be achieved. Curves 1204, 1206 and 1208 represents a Vboost versus Vpass relationship for low, room and high temperatures, respectively. A temperature range of, e.g., −30 to +85° C. may be used. Thus, Vboost is lower at higher temperatures, for a given Vpass.

Figure 12B:
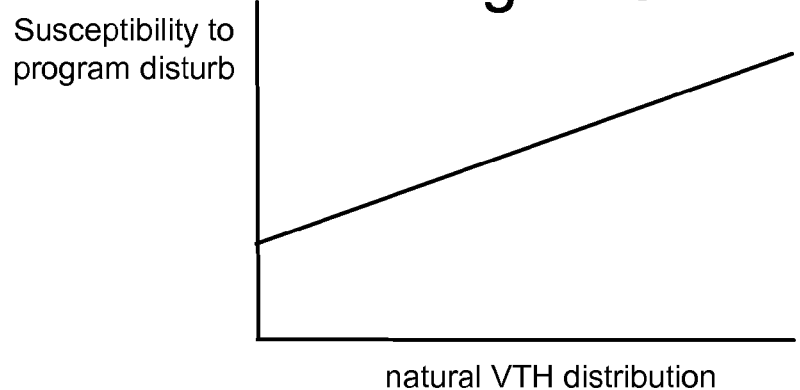
FIG. 12b depicts a susceptibility to program disturb as a function of natural threshold voltage distribution.

FIG. 12b depicts a susceptibility to program disturb as a function of natural threshold voltage distribution. As NAND flash memory continues to scale down, program disturb becomes more difficult to control. One cause of program disturb is the wider natural threshold voltage distribution which is seen with scaled down storage elements, due to a more severe short channel effect. A wider natural threshold voltage distribution indicates that there is a larger program speed difference between fast and slow storage elements, resulting in an increased probability of having erased state or other program disturb fails. Generally, susceptibility to program disturb, e.g., a probability or likelihood that program disturb will occur, is correlated with natural threshold voltage distribution, as indicated in FIG. 12b.

Figure 12C:
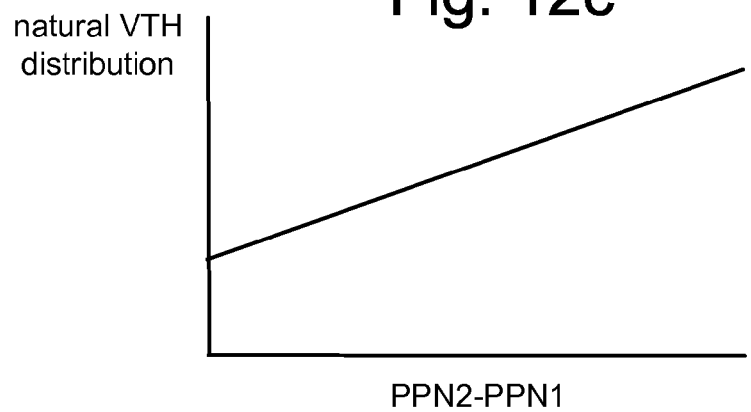
FIG. 12c depicts a natural threshold voltage distribution as a function of a difference between a program pulse number PPN2 needed to program N2 storage elements to a verify level and a program pulse number PPN1<PPN2 needed to program N1<N2 storage elements to the verify level.

FIG. 12c depicts a natural threshold voltage distribution as a function of a difference between a program pulse number PPN2 needed to program N2 storage elements to a verify level and a program pulse number PPN1<PPN2 needed to program N1<N2 storage elements to the verify level. As mentioned, larger variations in programming speed, represented by larger values of PPN2−PPN1, are correlated with a higher natural threshold voltage distribution.

Figure 12D:
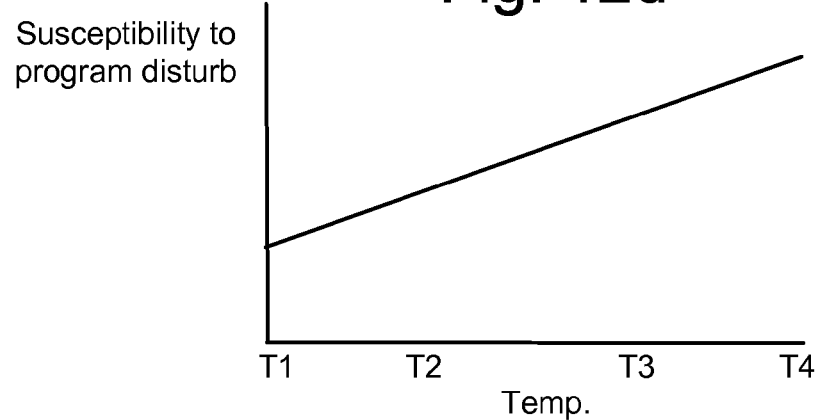
FIG. 12d depicts a susceptibility to program disturb as a function of temperature.

FIG. 12d depicts a susceptibility to program disturb as a function of temperature. Due to reasons including the reduction in channel boosting as temperature increases, higher temperatures are correlated with a higher susceptibility to program disturb. The range of temperatures may be classified into a low range, between T1 and T2, a middle range, between T2 and T3, and a high range, between T3 and T4.

Figure 12E:
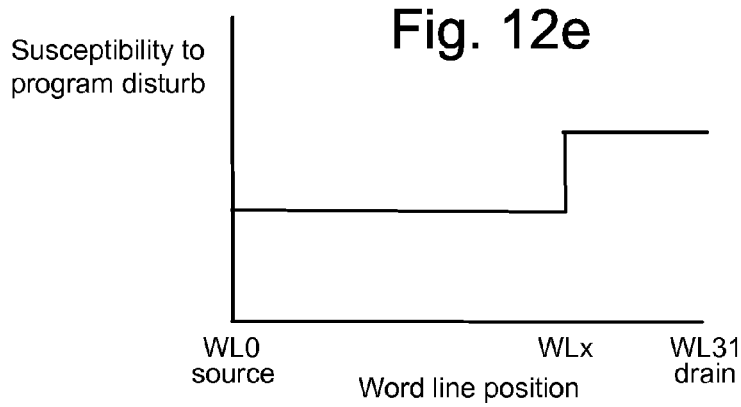
FIG. 12e depicts a susceptibility to program disturb as a function of word line position.

FIG. 12e depicts a susceptibility to program disturb as a function of word line position. Program disturb occurs more severely on word lines with a wide natural threshold voltage distribution and low channel boosting potential. In some cases, particular word lines may have more program disturb fails than neighboring word lines, even though the boosting is similar. This may be due, e.g., to some word lines having a narrower control gate due to the lithography process used to fabricate the memory device. A wider control gate width results in a wider natural threshold voltage distribution width, and higher susceptibility to program disturb. One approach is to measure the susceptibility to program disturb for each word line.

Moreover, word lines which are relatively close to a drain side of the set of word lines than to the source side can have a higher susceptibility to program disturb due to reduced channel boosting, as depicted in FIG. 12e. Specifically, the channel can often saturate earlier when the selected word line is a drain side word line than a middle word line or source side word line. This is true, e.g., for some boosting schemes in which an isolation voltage such as 0V is applied to at least one word line on a source side of the selected word line during the programming pulses. The isolation voltage cuts off the source side of the channel from the drain side, and during the drain side programming, the channel capacitance can become smaller so the boosting is lower.

In this example, a lower level of susceptibility to program disturb is indicated for word lines between WL0 and WLx−1, and a higher level of susceptibility to program disturb is indicated for word lines between WLx and WL31, assuming there are 32 word lines. WLx can be identified by testing. Another possible approach indicates a gradual increase in susceptibility to program disturb between WLx and WL31. Another possible approach provides a measured susceptibility for each individual word line which may not follow a continuous or well regulated pattern.

We can use different program disturb forecast criteria for different word lines, and make the criteria more stringent for word lines with low channel boosting during programming. Another option is to forecast program disturb only on the word lines which have the lowest channel boosting during program and are most susceptible to program disturb fails, such as WLx-WL31. In this case, we forecast program disturb are take a precautionary measure for a selected number of the drain-side word lines but not for other word lines in a block.

Figure 12F:
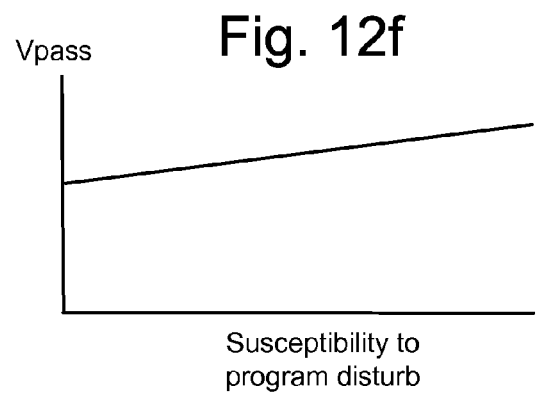
FIG. 12f depicts a pass voltage which can be set as a function of susceptibility to program disturb.

FIG. 12f depicts a pass voltage which can be set as a function of susceptibility to program disturb. Vpass may be increased in proportion to the determined susceptibility to program disturb, as discussed further below in connection with FIGS. 14 and 15.

FIG. 13 depicts programming pulses in a programming operation. Generally, a programming operation can involve applying a pulse train to a selected word line, where the pulse train includes programming pulses followed by one or more verify pulses. Note that a programming pulse can have any number of different waveform shapes. A square waveform is depicted, although other shapes are possible such as a multi-level shape or a ramped shape. The pulse train 1300 includes a series of programming pulses 1305, 1310, 1315, 1320, 1325, 1330, 1335, 1340, 1345, 1350, 1355, 1360, 1365, 1370, 1375, ..., that are applied to a word line selected for programming, at times t1-t15, respectively. In one embodiment, the programming pulses have a voltage, $V_{PGM}$, which starts at 12 V and increases by increments, e.g., 0.5 V, for each successive programming pulse until a maximum of, e.g., 20-25 V is reached. In between the programming pulses are verify pulses, e.g., three verify pulses, which are used in a verify operation. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 9), or one verify pulse with an amplitude of Vvb' may be used (FIG. 10a), for instance. Example verify pulses 1306 follow the programming pulse 1305.

As mentioned in connection with FIGS. 8, 9 and 10a, storage elements which are being programmed to a selected state, referred to as a tracked state, can be tracked to determine when some portion of the storage elements first reach the tracked state. Moreover, the corresponding program pulse numbers can be identified and recorded. For example, PPN1=8 pulses are needed for N1 of the tracked state storage elements to reached the tracked state, and PPN2=14 pulses (6 additional pulses) are needed for N2 of the tracked state storage elements to reach the tracked state or, alternatively, for N1 (or some other number) or fewer A-state storage elements to have not yet reached the tracked state. A natural threshold voltage distribution for the set of storage elements, such as on a particular word line, can be determined from PPN2-PPN1, for instance. Alternatively, the amplitudes of the program pulses can be identified and recorded, and the natural threshold voltage distribution can be determined from the difference in amplitude. The pulse numbers PPN1 and PPN2 indicate respective sequential positions of the associated programming pulses in the series 1300 of programming pulses.

When programming upper and lower pages of data, the pulse train 1300 may be applied a first time as a first series of programming pulses to program the lower page, and a second time as a second series of programming pulses to program the upper page.

Figure 14:
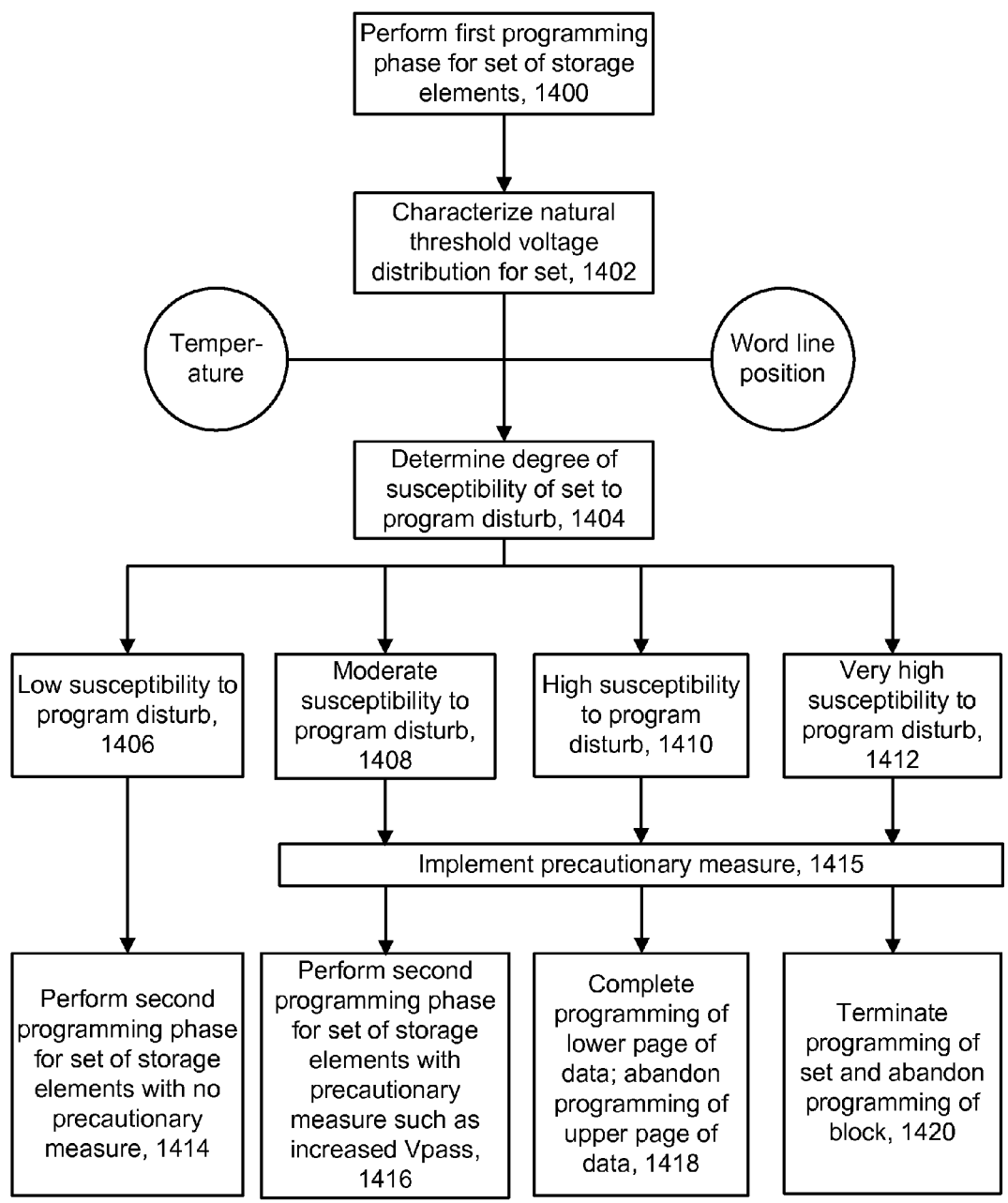
FIG. 14 is a flow chart describing one embodiment of an overview of a method for programming non-volatile memory.

FIG. 14 is a flow chart describing one embodiment of an overview of a method for programming non-volatile memory. As mentioned, susceptibility to program disturb of a set of storage elements on a word line is a function of the boosting potential in the inhibited channels. Each channel is associated with a NAND string in which a respective storage element on the selected word line is located. However, since boosting is limited, program disturb can still result. Forecasting the likelihood of program disturb, using the natural threshold voltage distribution and other factors, and implementing precautionary measures to reduce the likelihood of program disturb, can therefore be helpful.

In an example programming technique, at step 1400, a first programming phase is performed for a set of storage elements, such as for storage elements associated with a selected word line. The first programming phase may involve programming a lower page of data. At step 1402, the natural threshold voltage distribution width is detected. This information, optionally along with temperature and word line position, is used to determine a degree of susceptibility of the set of storage elements to program disturb, at step 1404. For example, a score or other metric may be provided for the set of storage elements based on the natural threshold voltage distribution, temperature and/or word line position. The score can then be compared to different thresholds to categorize the degree of susceptibility. Based on the degree of susceptibility to program disturb, a precautionary measure can be selected and implemented before program disturb occurs, to reduce the likelihood that it does occur.

A susceptibility metric may be based on the natural threshold voltage distribution as represented by PPN2-PPN1 with optional adjustment for temperature and word line position. For example, in FIG. 13, PPN2-PPN1=14-8=6, or 6 points. Moreover, referring to FIG. 12d, the point score may be increased by, e.g., 1 point if the temperature is within a specified high range, decreased by, e.g., 1 point if the temperature is within a specified low range, or not changed if the temperature is within a specified middle range. Referring to FIG. 12e, the point score may be increased by, e.g., 1 point if the word line is sufficiently close to the drain side of a set of word lines (e.g., WLx or higher) or not changed if the word line is not sufficiently close to the drain side of the set of word lines.

A low, moderate, high or very high susceptibility to program disturb may be indicated when the susceptibility metric is within a first, second, third or fourth range of values, respectively. An example breakdown for the susceptibility metric (SM) is: $0 \leq SM \leq 3 \rightarrow$ low susceptibility, $3 < SM \leq 6 \rightarrow$ moderate susceptibility, $6 < SM \leq 9 \rightarrow$ high susceptibility, and $0 < 9SM \rightarrow$ very high. Four categories of susceptibility are used as an example. Two or more categories may be used. Furthermore, the metric scores are simply illustrations. The actual metrics which are optimal for a particular set of storage elements can be determined by testing. The adjustments based on temperature and word line position similarly can be optimized for a particular set of storage elements.

At step 1406, for a low susceptibility to program disturb, a second programming phase may be performed for the set of storage elements with no precautionary measure (step 1414). The second programming phase can involve programming which occurs after the first programming phase. For example, in FIG. 13, the first programming phases occurred from t1 to just before t15, in which case the second programming phase can involve continuing to apply programming pulses starting at t15. For direct sequence programming such as in FIG. 8, the pulse train 1300 is applied once to the storage elements during programming. In this case, programming pulses starting at t15 allow programming to all states to be completed.

In the two-pass programming of FIGS. 9-10c, the pulse train is applied once for the lower page data, in the first pass, and a second time for the upper page data, in a second pass. Thus, the programming pulses starting at t15 allow programming of the lower page to be completed. Subsequently, the upper page is programmed with a new pulse train, with no re-determining susceptibility to program disturb and no precautionary measures. The memory device remembers that no precautionary measure is needed as it completes the programming of the set of storage elements. When the set of storage elements is programmed again at a later time, with new data, the susceptibility to program disturb can be newly determined, as factors such as temperature may have changed. The cost of determining susceptibility to program disturb in terms of processing time is insignificant.

At steps 1408, 1410, 1412, there is a moderate, high or very high susceptibility to program disturb, in which case a precautionary measure is implemented (step 1415). For a moderate susceptibility to program disturb (1408), the second programming phase may be performed for the set of storage elements with a precautionary measure such as increasing Vpass (step 1416). Vpass can be increased to a predetermined level, for instance. An optimal level can be determined from tests. In another possible approach, Vpass is increased by an amount which is in proportion to the degree of susceptibility to program disturb (see FIG. 12f). The memory device remembers to implement the precautionary measure as it completes the programming of the set of storage elements. Programming can continue for a lower and/or upper page with the precautionary measure, from the point in the programming process at which the susceptibility to program disturb was determined. In another possible approach, programming of a lower page can be completed without implementing the precautionary measure. The precautionary measure is then implemented while programming the upper page.

At step 1410, for a high susceptibility to program disturb, programming of a lower page of data may be completed, and the precautionary measure is to abandon programming of an upper page of data on the same set of storage elements in which the lower page was programmed (step 1418). Note that the lower page of data may be almost completely programmed at the time the susceptibility to program disturb is determined, so that programming can usually be completed relatively soon. For example, 95% of the tracked state storage elements may have completed programming when the susceptibility to program disturb is determined, so that only 5% of the tracked state storage elements need to finish programming. The programming of the lower page can be completed with or without a precautionary measure such as an increased Vpass.

One reason for abandoning programming of the upper page of data on the same set of storage elements is that one or more upper pages of the selected word line require higher amplitude program pulses since they are programming to higher VTH levels. This can easily cause program disturb. Avoiding the higher amplitude program pulses reduces the likelihood of program disturb. Instead, the upper page of data can be programmed to another word line in the same block in which the lower word line was programmed, or even in a different block. This results in binary data of the lower and upper pages being programmed to different word lines. Other word lines may be used for multi-level data if their susceptibility to program disturb is not too high, so that both binary and multilevel storage elements are present in the same block. For example, in the programming scheme of FIG. 9, the lower page of data uses distributions 800 and 802. If the upper page of data is not programmed on the same word line as the lower page, distributions 804 and 806 are not used on that word line. Instead, distributions 804 and 806 are used on another word line. Similarly, in the programming scheme of FIG. 10a-c, the lower page of data uses distributions 1002 and 1012. If the upper page of data is not programmed on the same word line as the lower page, distributions 1004, 1006 and 1008 are not used on that word line.

Still referring to FIG. 14, at step 1412, for a very high susceptibility to program disturb, a precautionary measure can be implemented such as immediately terminating programming of the set of storage elements so that no further programming of the block takes place (step 1420). Storage elements on other word lines in the particular block which have already been programmed can remain programmed, or their data can be reprogrammed to another block and the entire particular block declared unusable.

Note that process of FIG. 14 can be performed separately for each word line. Different word lines in a block can have different degrees of susceptibility to program disturb due to word line position, effects of imperfect lithography and other factors. Consequently, different precautionary measures can be implemented on different word lines, and some word lines may have precautionary measures implemented while others do not. Another option is to forecast program disturb (e.g., using steps 1402 and 1404) only on the word lines which have the lowest channel boosting during program and are most susceptible to program disturb fails, such as WLx-WL31. In this case, susceptibility to program disturb is not determined for WL0-WLx−1.

Figure 15:
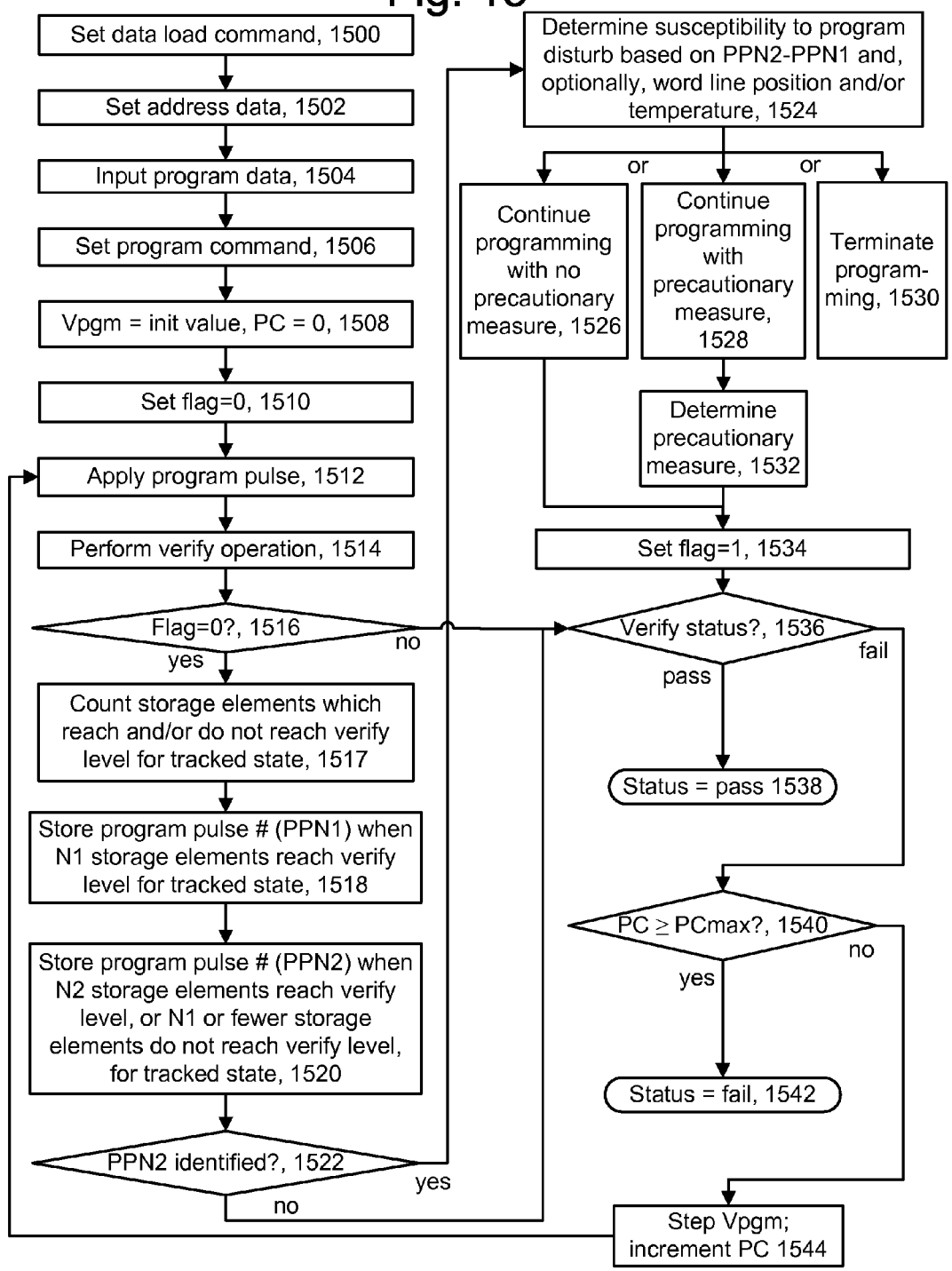
FIG. 15 is a flow chart describing one embodiment of a detailed method for programming non-volatile memory.

FIG. 15 is a flow chart describing one embodiment of a method for programming non-volatile memory. In one implementation, storage elements are erased (in blocks or other units) prior to programming. In step 1500, a "data load" command is issued by the controller and input received by control circuitry 510. In step 1502, address data designating the page address is input to decoder 514 from the controller or host. In step 1504, a page of program data for the addressed page is input to a data buffer for programming. A lower page of data may be input initially, for instance, when upper and lower pages of data are programmed separately. That data is latched in the appropriate set of latches. In step 1506, a "program" command is issued by the controller to state machine 512.

Triggered by the "program" command, the data latched in step 1504 will be programmed into the selected storage elements controlled by state machine 512 using the stepped programming pulses of the pulse train 1300 of FIG. 13 applied to the appropriate selected word line. Specifically, in step 1508, the program voltage, $V_{PGM}$, is initialized to the starting pulse (e.g., 12 V or other value) and a program counter (PC) maintained by state machine 512 is initialized at zero. In step 1510, a flag is set to zero. The flag indicates whether a susceptibility to program disturb has been determined (flag=0 for not determined, flag=1 for determined). A programming pulse is applied at step 1512 to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1514, the states of the selected storage elements are verified in a verify operation. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed.

At decision step 1516, if flag=0, then step 1517 is performed, in which a count is maintained of a number of storage elements which reach and/or do not reach a verify level for a tracked state (such as verify level Vva in FIG. 8 when the A-state is the tracked state, or verify level Vvb' in FIG. 10a when the B'-state is the tracked state). At step 1518, the program pulse number (PPN1) is identified and stored when N1 storage elements reach the verify level for the tracked state. At step 1520, the program pulse number (PPN2) is stored when N2 storage elements reach the verify level for the tracked state or, alternatively, N1 (or some other number) or fewer tracked-state storage elements have not yet reached the tracked state. Steps 1517, 1518 and 1520 may be performed in conjunction with step 1514.

At decision step 1522, if PPN2 has been identified, step 1524 is performed. Step 1524 determines a susceptibility to program disturb based on PPN2−PPN1 and optionally, word line position and temperature. Based on the degree of susceptibility, one of three paths can be followed. Step 1526 includes continuing programming with no precautionary measure. Step 1528 includes continuing programming with a precautionary measure, and step 1532 includes determining the precautionary measure based on the susceptibility to program disturb, such as using a higher Vpass, or abandoning programming of the upper page of data. Step 1530 includes terminating programming immediately, such as for an entire block. The flag is set to one at step 1534.

In decision step 1536, a check is made as to whether all of the data latches are storing logic "1." If all of the data latches are storing logic "1," the programming process is complete and successful because all selected storage elements were programmed and verified. For example, all lower page data or all upper page data has been programmed. Or, for direct sequence programming, all data has been programmed. A status of "PASS" is reported in step 1538. In some embodiments, the programming process is considered complete and successful even if not all selected storage elements were verified as being programmed. In such a case, errors during subsequent read operations can occur due to insufficiently programmed storage elements. However, these errors can be corrected by ECC.

If, in step 1536, it is determined that not all of the data latches are storing logic "1," then the programming process continues. In some embodiments, the program process stops even if not all of the data latches are storing logic "1". In decision step 1540, the program counter PC is checked against a program limit, PCmax. One example of a program limit value is twenty; however, other numbers can also be used. If PC≧PCmax, the program process has failed and a status of "FAIL" is reported in step 1542. If PC<PCmax, then, at step 1544, $V_{PGM}$ is increased by the step size, and PC is incremented by one. The process then loops back to step 1512 to apply the next program pulse. Programming then continues as discussed, with a precautionary measure implemented, if applicable.

With flag=1 at decision step 1516, the verify decision step 1536 is performed next, as there is no need to re-determine the susceptibility to program disturb.

At decision step 1522, if PPN2 has not yet been identified, the verify decision step 1536 is performed, as the susceptibility to program disturb cannot yet be determined.

As can be seen, provided herein, in one embodiment, is a method for operating non-volatile storage includes: (a) performing a first programming phase by applying a first series of programming pulses to a selected word line in a block of storage elements in the non-volatile storage system, where the selected word line is in communication with selected storage elements of the block. The method further includes: (b) determining when threshold voltages of a first portion of the selected storage elements exceed a verify level, and identifying an associated programming pulse in the first series, (c) determining when threshold voltages of a second portion of the selected storage elements exceed the verify level, and identifying an associated programming pulse in the first series, (d) determining, based at least in part on the associated programming pulses, whether a precautionary measure to reduce a probability of program disturb in the selected storage elements is indicated, and (e) implementing the precautionary measure if the precautionary measure is indicated.

In another embodiment, a non-volatile storage system includes a set of storage elements, a set of word lines in communication with the set of storage elements, and one or more control circuits in communication with the set of word lines. The one or more control circuits: (a) performing a first programming phase by applying a first series of programming pulses to a selected word line in a block of storage elements in the non-volatile storage system, where the selected word line is in communication with selected storage elements of the block, (b) determine when threshold voltages of a first portion of the selected storage elements exceed a verify level, and identify an associated programming pulse in the first series, (c) determine when threshold voltages of a second portion of the selected storage elements exceed the verify level, and identify an associated programming pulse in the first series, (d) determine, based at least in part on the associated programming pulses, whether a precautionary measure to reduce a probability of program disturb in the selected storage elements is indicated, and (e) implement the precautionary measure if the precautionary measure is indicated.

In another embodiment, a method for operating non-volatile storage includes: (a) performing a first programming phase by applying a first series of programming pulses to a selected word line in a block of storage elements in the non-volatile storage system, where the selected word line is in communication with selected storage elements of the block, (b) characterizing a natural threshold voltage distribution of the selected storage elements based on the first programming phase, (c) determining, based at least in part on the characterizing, a degree of susceptibility to program disturb by the selected storage elements, and (d) implementing a selected precautionary measure from a plurality of available precautionary measures based on the degree of susceptibility.

In another embodiment, a non-volatile storage system includes a block of storage elements including selected storage elements, a set of word lines in communication with the set of storage elements, including a selected word line in communication with the selected storage elements, and one or more control circuits in communication with the set of word lines. The one or more control circuits: (a) perform a first programming phase by applying a first series of programming pulses to the selected word line, (b) determine when threshold voltages of a first portion of the selected storage elements pass a verify level, and identify an associated programming pulse in the first series, (c) determine when threshold voltages of a second portion of the selected storage elements pass the verify level, and identify an associated programming pulse in the first series, (d) determine, based at least in part on a difference between pulse numbers of the associated programming pulses, where the pulse numbers indicate respective sequential positions of the associated programming pulses in the first series of programming pulses, whether a precautionary measure to reduce a probability of program disturb in the selected storage elements is indicated, and (e) implement the precautionary measure if the precautionary measure is indicated.

Corresponding methods, systems and computer- or processor-readable storage devices for performing the methods provided herein may also be provided.

The foregoing detailed description has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for operating a non-volatile storage system, comprising:
performing a first programming phase by applying a first series of programming pulses to a selected word line in a block of storage elements in the non-volatile storage system, the selected word line is in communication with selected storage elements of the block;
determining when threshold voltages of a first portion of the selected storage elements exceed a verify level, and identifying an associated programming pulse in the first series;
determining when threshold voltages of a second portion of the selected storage elements exceed the verify level, and identifying an associated programming pulse in the first series;
determining, based at least in part on the associated programming pulses, whether a precautionary measure to reduce a probability of program disturb in the selected storage elements is indicated; and
implementing the precautionary measure if the precautionary measure is indicated.

2. The method of claim 1, wherein:
the verify level is associated with a data state which represents at least one bit of data.

3. The method of claim 1, wherein:
the verify level is associated with an intermediate state which does not represent at least one bit of data.

4. The method of claim 1, wherein:
the determining whether the precautionary measure is indicated is based at least in part on a difference between pulse numbers of the associated programming pulses, the pulse numbers indicate respective sequential positions of the associated programming pulses in the first series of programming pulses.

5. The method of claim 1, wherein:
the first programming phase at least partly programs a lower page of data into the selected storage elements; and
the implementing the precautionary measure comprises abandoning programming of an upper page of data on the selected word line, and programming the upper page of data on another word line.

6. The method of claim 1, wherein:
the implementing the precautionary measure comprises abandoning programming of the block.

7. The method of claim 1, wherein:
during the first programming phase, pass voltages at a first level are applied to unselected word lines which are in communication with unselected storage elements in the block; and
the method further comprises performing a second programming phase after the first programming phase by applying a second series of programming pulses to the selected word line, the precautionary measure is implemented by increasing a level of the pass voltages to a second level, higher than the first level, in the second programming phase.

8. The method of claim 7, further comprising:
determining a degree to which the precautionary measure is indicated, based at least in part on the associated programming pulses, the second level is higher than the first level in proportion to the degree.

9. The method of claim 7, wherein:
the first programming phase programs a lower page of data into the selected storage elements; and
the second programming phase programs an upper page of data into the selected storage elements.

10. The method of claim 1, further comprising:
determining, based at least in part on a position of the selected word line, among a set of word lines of the block, whether the precautionary measure is indicated.

11. The method of claim 10, wherein:
the precautionary measure is more strongly indicated when the position of the selected word line is within a specified number of word lines from a drain side of the set of word lines than when the position of the selected word line is not within the specified number of word lines from the drain side of the set of word lines.

12. The method of claim 1, further comprising:
determining, based at least in part on a temperature, whether the precautionary measure is indicated, the precautionary measure is more strongly indicated when the temperature is higher than when the temperature is lower.

13. A method for operating a non-volatile storage system, comprising:
performing a first programming phase by applying a first series of programming pulses to a selected word line in a block of storage elements in the non-volatile storage system, the selected word line is in communication with selected storage elements of the block;
characterizing a natural threshold voltage distribution of the selected storage elements based on the first programming phase;
determining, based at least in part on the characterizing, a degree of susceptibility to program disturb by the selected storage elements; and
implementing a selected precautionary measure from a plurality of available precautionary measures based on the degree of susceptibility.

14. The method of claim 13, wherein:
during the first programming phase, pass voltages at a first level are applied to unselected word lines of the block; and
the method further comprises performing a second programming phase after the first programming phase by applying a second series of programming pulses to the selected word line, the selected precautionary measure is implemented by increasing a level of the pass voltages to a second level, higher than the first level, in the second programming phase.

15. The method of claim 13, wherein:
the first programming phase programs a lower page of data into the selected storage elements;
the selected precautionary measure is implemented by foregoing performing a second programming phase to program an upper page of data into the selected storage elements.

16. The method of claim 13, wherein:
the selected precautionary measure is implemented by abandoning programming of the block.

17. A non-volatile storage system, comprising:
a block of storage elements including selected storage elements;
a set of word lines in communication with the set of storage elements, including a selected word line in communication with the selected storage elements; and
one or more control circuits in communication with the set of word lines, the one or more control circuits: (a) perform a first programming phase by applying a first series of programming pulses to the selected word line, (b) determine when threshold voltages of a first portion of the selected storage elements pass a verify level, and identify an associated programming pulse in the first series, (c) determine when threshold voltages of a second portion of the selected storage elements pass the verify level, and identify an associated programming pulse in the first series, (d) determine, based at least in part on a difference between pulse numbers of the associated programming pulses, the pulse numbers indicate respective sequential positions of the associated programming pulses in the first series of programming pulses, whether a precautionary measure to reduce a probability of program disturb in the selected storage elements is indicated, and (e) implement the precautionary measure if the precautionary measure is indicated.

18. The non-volatile storage system of claim 17, wherein:
the first programming phase programs a lower page of data into the selected storage elements; and
the one or more control circuits implement the precautionary measure by foregoing performing a second programming phase to program an upper page of data into the selected storage elements.

19. The non-volatile storage system of claim 17, wherein:
the one or more control circuits implement the precautionary measure by abandoning programming of the block.

20. The non-volatile storage system of claim 17, wherein:
during the first programming phase, the one or more control circuits apply pass voltages at a first level to unselected word lines in the block; and
the one or more control circuits perform a second programming phase after the first programming phase by applying a second series of programming pulses to the selected word line, the precautionary measure is implemented by increasing a level of the pass voltages to a second level, higher than the first level, in the second programming phase.

\* \* \* \* \*